(12) United States Patent
Anemikos et al.

(10) Patent No.: US 8,421,495 B1
(45) Date of Patent: Apr. 16, 2013

(54) SPEED BINNING FOR DYNAMIC AND ADAPTIVE POWER CONTROL

(75) Inventors: Theodoros E. Anemikos, Milton, VT (US); Jeanne P. Bickford, Essex Junction, VT (US); Nazmul Habib, South Burlington, VT (US); Susan K. Lichtensteiger, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/288,269

(22) Filed: Nov. 3, 2011

(51) Int. Cl.
*H03K 19/003* (2006.01)

(52) U.S. Cl.
USPC ..................................... 326/9; 326/14; 326/16

(58) Field of Classification Search .................. None
See application file for complete search history.

(56) References Cited

U.S. PATENT DOCUMENTS

| | | | |
|---|---|---|---|
| 7,363,176 B2 | 4/2008 | Patel et al. | |
| 7,475,366 B2 * | 1/2009 | Kuemerle et al. | 716/134 |
| RE41,596 E | 8/2010 | Gizara | |
| 7,793,237 B2 | 9/2010 | Bonaccio et al. | |
| 7,810,054 B2 | 10/2010 | Anemikos et al. | |
| 7,877,714 B2 | 1/2011 | Anemikos et al. | |
| 2008/0034337 A1 | 2/2008 | Kuemerle et al. | |
| 2008/0120065 A1 | 5/2008 | Joshi et al. | |
| 2009/0259869 A1 | 10/2009 | Naffziger | |
| 2010/0017042 A1 | 1/2010 | Lopata | |
| 2011/0106497 A1 * | 5/2011 | Visweswariah et al. | 702/182 |

* cited by examiner

*Primary Examiner* — Anh Tran
(74) *Attorney, Agent, or Firm* — Gibb & Riley, LLC; Richard M. Kotulak, Esq.

(57) ABSTRACT

A plurality of digital circuits are manufactured from an identical circuit design. A power controller is operatively connect to the digital circuits, and a non-volatile storage medium is operatively connected to the power controller. The digital circuits are classified into different voltage bins, and each of the voltage bins has a current leakage limit. Each of the digital circuits has been previously tested to operate within a corresponding current leakage limit of a corresponding voltage bin into which each of the digital circuits has been classified. The non-volatile storage medium stores boundaries of the voltage bins as speed-binning test data. The power controller controls power-supply signals applied differently for each of the digital circuits based on which bin each of the digital circuit has been classified and the speed-binning test data.

24 Claims, 7 Drawing Sheets

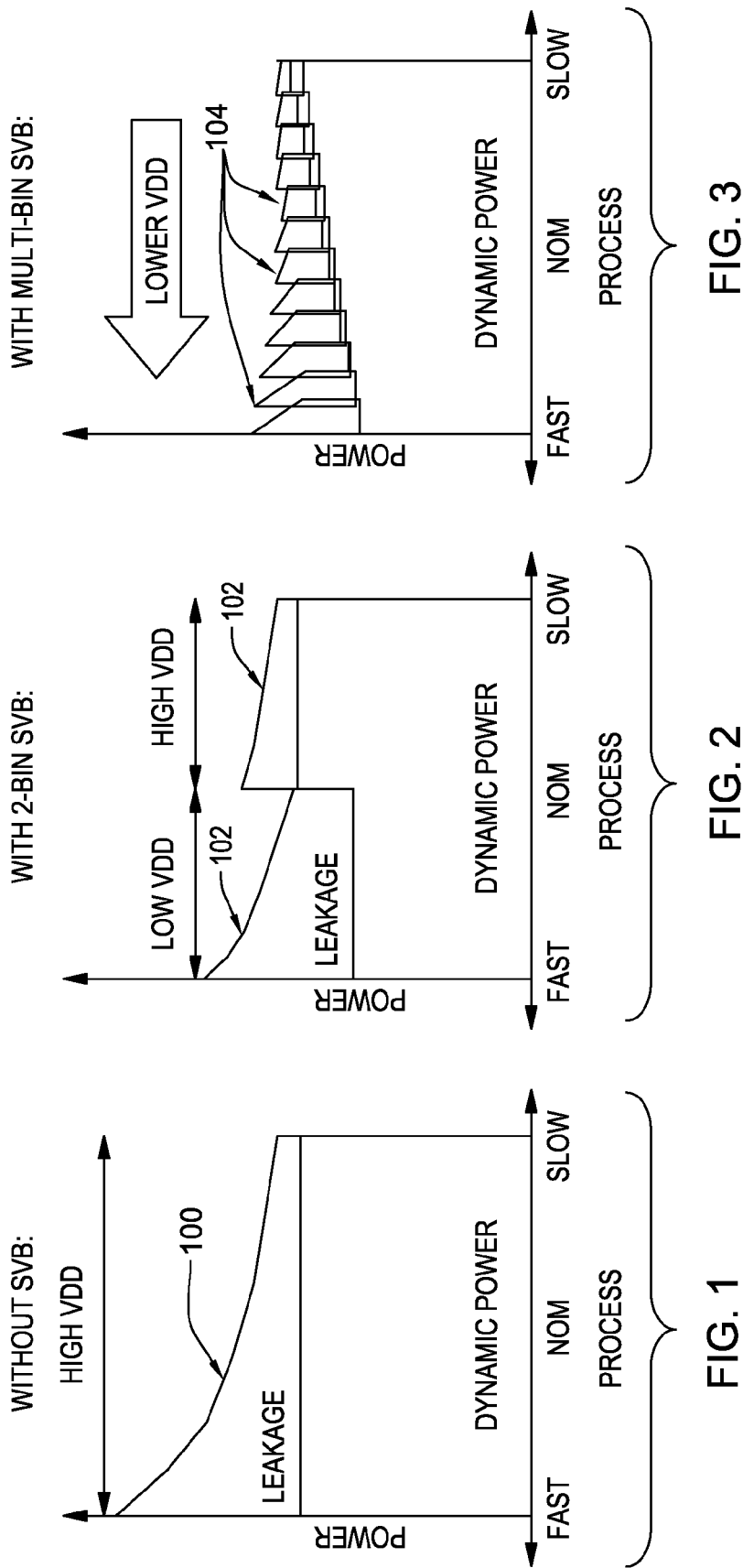

SPEED BINNING FOR DYNAMIC AND ADAPTIVE POWER CONTROL

BACKGROUND

The embodiments of the invention generally relate to optimizing power usage in integrated circuit designs and more particularly to methods and designs that sort identical integrated circuit devices into voltage bins and test such integrated circuit devices to ensure that they are within prescribed current leakage limits for each of the different voltage bins.

Manufacturing variations may cause one or more parameters to vary between integrated circuits that are formed according to the same design. These variations can affect chip operating frequency (i.e., switching speed). For example, due to variations in the equipment, operators, position on a wafer, etc., a specific parameter may vary between chips built on the same wafer, chips built on different wafers in the same lot and/or on chips built on different wafers in different lots. If this parameter is, for example, channel length, width or threshold voltages, the transistors of each chip may be different such that the performance varies (e.g., faster or slower). Chips that are fabricated either at the "slow" end or the "fast" end of a process distribution (e.g., a process-temperature-variation (PVT) space) may not be desirable. For example, chips that are fabricated at the "slow" end of such a process distribution may not meet the desired performance specification (i.e., may not have a fast enough switching speed), whereas chips fabricated at the "fast" end of this process distribution may exhibit excessive power and leakage current. Thus, it is possible to run faster parts at lower voltage and slower parts at higher voltage, in order to reduce the maximum power for the distribution of parts. The division between the fast and slow portions of the distribution (i.e. the cut-point), is generally determined apriori during the design phase.

SUMMARY

According to one embodiment herein, a method of optimizing power usage in an integrated circuit design manufactures integrated circuit devices according to an integrated circuit design using manufacturing equipment. The integrated circuit design produces integrated circuit devices that are identically designed, but perform at different operating speeds caused by manufacturing process variations. The method sorts the integrated circuit devices after manufacture into relatively slow integrated circuit devices and relatively fast integrated circuit devices to classify the integrated circuit devices into different voltage bins. The relatively fast integrated circuit devices consume more power than the relatively slow integrated circuit devices. The method establishes a bin-specific current leakage limit for each of the voltage bins and tests the current leakage amounts of the integrated circuit devices using a tester. This allows the method to identify as defective ones of the integrated circuit devices that exceed the bin-specific integrated circuit current leakage limit of a corresponding voltage bin into which each of the digital circuits has been classified. The method removes the defective ones of the integrated circuit devices to allow only non-defective integrated circuit devices to remain and supplies the non-defective integrated circuit devices to a customer.

According to another embodiment herein, a method of optimizing power usage in an integrated circuit design manufactures integrated circuit devices according to an integrated circuit design using manufacturing equipment. The integrated circuit design produces integrated circuit devices that are identically designed, but perform at different operating speeds caused by manufacturing process variations. The method sorts the integrated circuit devices after manufacture into relatively slow integrated circuit devices and relatively fast integrated circuit devices to classify the integrated circuit devices into different voltage bins. The relatively fast integrated circuit devices consume more power than the relatively slow integrated circuit devices. The method establishes a bin-specific current leakage limit for each of the voltage bins and tests the current leakage amounts of the integrated circuit devices using a tester. This allows the method to identify as defective ones of the integrated circuit devices that exceed the bin-specific integrated circuit current leakage limit of a corresponding voltage bin into which each of the digital circuits has been classified. The method removes the defective ones of the integrated circuit devices to allow only non-defective integrated circuit devices to remain and operatively connects a plurality of the non-defective integrated circuit devices to a power controller to create a device.

According to a further embodiment herein, a device comprises a plurality of digital circuits manufactured from an identical circuit design, a power controller operatively connect to the digital circuits, and a non-volatile storage medium operatively connected to the power controller. The digital circuits are classified into different voltage bins, and each of the voltage bins has a current leakage limit. The non-volatile storage medium stores boundaries of the voltage bins as speed-binning test data. The power controller controls power-supply signals applied differently for each of the digital circuits based on which bin each of the digital circuit has been classified and the speed-binning test data.

According to an additional embodiment herein, a device comprises a plurality of digital circuits manufactured from an identical circuit design, a power controller operatively connect to the digital circuits, and a non-volatile storage medium operatively connected to the power controller. The digital circuits are classified into different voltage bins, and each of the voltage bins has a current leakage limit. Each of the digital circuits has been previously tested to operate within a corresponding current leakage limit of a corresponding voltage bin into which each of the digital circuits has been classified. The non-volatile storage medium stores boundaries of the voltage bins as speed-binning test data. The power controller controls power-supply signals applied differently for each of the digital circuits based on which bin each of the digital circuit has been classified and the speed-binning test data.

BRIEF DESCRIPTION OF THE DRAWINGS

The embodiments herein will be better understood from the following detailed description with reference to the drawings, which are not necessarily drawing to scale and in which:

FIG. 1 is a chart illustrating the relationship between process speed and power usage for integrated circuits manufactured with the same process;

FIG. 2 is a chart illustrating the relationship between process speed and power usage for integrated circuits manufactured with the same process using a 2-bin selective binning process;

FIG. 3 is a chart illustrating the relationship between process speed and power usage for integrated circuits manufactured with the same process using a multi-bin selective binning process;

DETAILED DESCRIPTION

Figure 4:
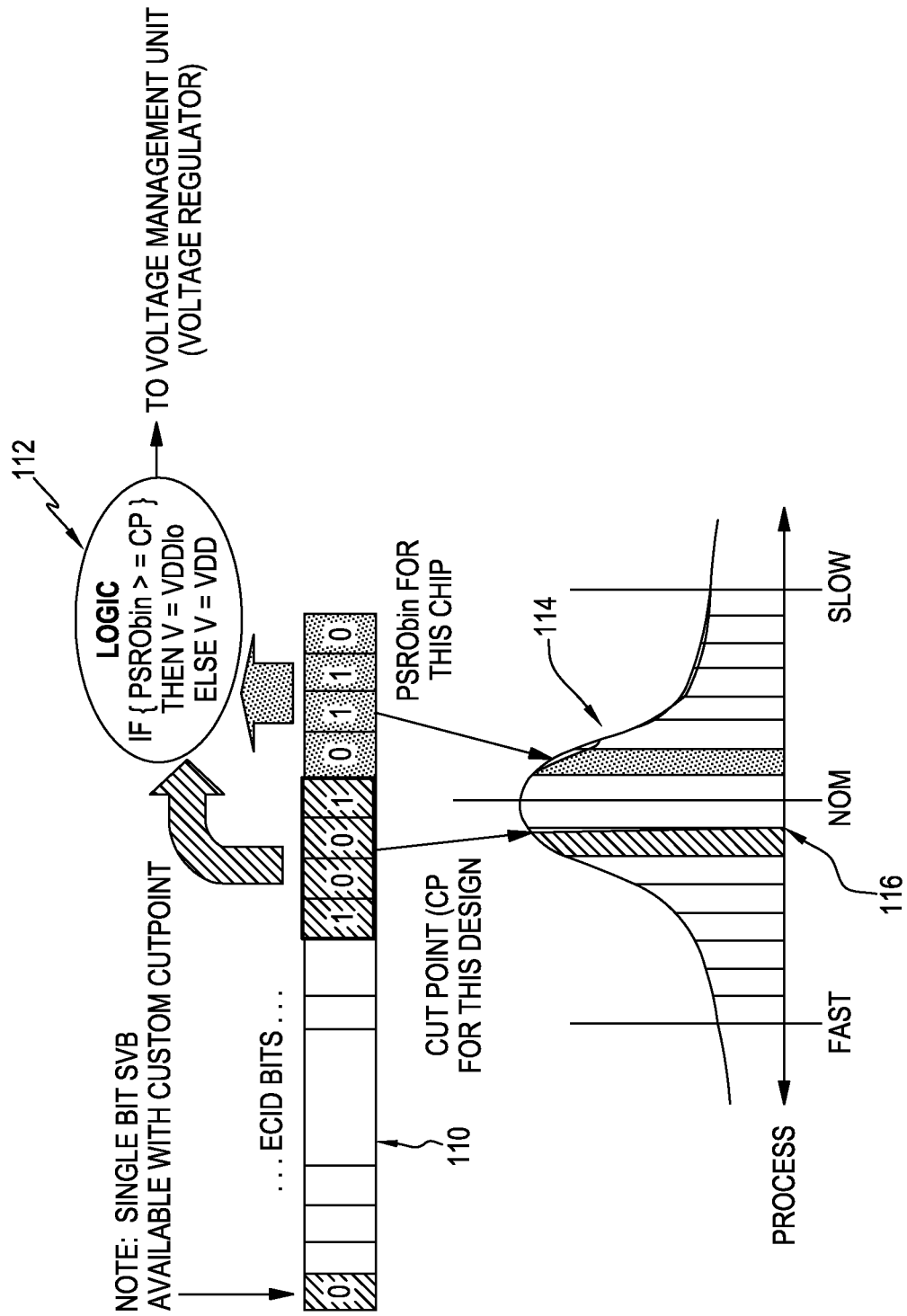
FIG. 4 is a chart illustrating the cut points of selective voltage binning.

As mentioned above, the process of selective voltage binning can run faster parts at lower voltage and slower parts at higher voltage, in order to reduce the maximum power for the distribution of parts. However, conventional selective voltage binning assumes a certain non-changing performance/current leakage relationship, which may not always be correct. Indeed, some large variation in current leakage can occur. Because of this, customers are often advised that the binned devices may not precisely operate within their specific bin classification and, instead, each is provided with a +/− bin variation range (e.g., +/−3 bins). The embodiments described below address this issue and are able to supply binned devices that are guaranteed to operate within their specific voltage bin (without requiring a bin variation range).

More specifically, the technology and design system development herein identifies a bounding performance versus current leakage curve and integrates such a curve into the power estimation tool. During product design, the embodiments herein use the power estimation tool (with the bounding current leakage limit) to calculate current leakage for each bin at customer use conditions, calculate the total power for each bin at customer use conditions, and calculate leakage for each bin at test conditions. During product testing, performance is measured, the leakage screen for performance is applied and any noncompliant product is scrapped or classified as nonconforming. This provides lower system power consumption without requiring a bin variation range because the leakage power is guaranteed by the current leakage screening process. This avoids "escapes" and possible system "meltdown."

FIG. 1 is a chart illustrating the relationship between process speed and power usage for identically manufactured integrated circuit devices. FIG. 2 is a chart illustrating the relationship between process speed and power usage for integrated circuits manufactured with the same process using a 2-bin selective binning process, and FIG. 3 is a chart illustrating the relationship between process speed and power usage for integrated circuits manufactured with the same process using a multi-bin selective binning process.

Post-manufacturing voltage binning is a technique that is used to sort manufactured chips into bins based on whether they were fabricated at either the "slow" end or the "fast" end of a process distribution, and to vary the voltage requirements for the chips depending upon the bins they are assigned to in order to reduce maximum chip power. For example, FIG. 1 is a diagram illustrating the dynamic power and process speed for chips that are manufactured from a common design, but that are different because of different processing conditions that occur within acceptable manufacturing tolerances.

In FIG. 1, the worst-case process range on curve 100 drives the required voltage for ultimately running the chip, creating an unnecessarily high operating voltage. However, with selective voltage binning shown in FIGS. 2 and 3, every chip is tested to measure operating speed and the chips are sorted into voltage bins accordingly. This reduces maximum chip power by running fast process chips at lower Vdd, as shown by curves 102 and 104. Thus, the devices are binned by process, and slow chips are operated at normal Vdd without change to slow-corner voltage, timing, and power (because slow-corner power is not limiting). However, as shown in FIGS. 2-3, fast chips are operated at reduced Vdd because the fast chips have speed to spare, and at reduced Vdd, power is reduced.

For example, in a process-voltage-temperature space, the temperature and voltage of the chip may be fixed and the leakage may be measured. If the leakage is above a specific cut point, then the chip is on the fast end of the process-voltage-temperature space and placed in a fast chip bin. If the leakage is below the cut point, then the chip is on the slow end of the process-voltage-temperature space and placed in a slow chip bin. After the chips are sorted into bins according to the cut point, an optimal supply voltage (Vdd) for operating the chips in each bin is determined. Since both dynamic power consumption and static power consumption are exponentially proportional to the Vdd, a reduction in the required Vdd will reduce both dynamic and leakage power consumption and, thus, overall power consumption.

In FIG. 4, item 116 represents the selective voltage binning (SVB) cut point between what is considered to be a fast device and what is considered to be a slow device along curve 114. The fast devices will sorted into the "fast" bin and will be utilized at lower voltages than the slow devices that are sorted into the "slow" bin. Because the fast devices have more leakage, the fast devices will consume more power.

In FIG. 4, item 110 represents the electronic chip identification data (ECID) that will be stored on the chip. Thus, the ECID value is burned into the device based on process, the customer reads the ECID (which can be tied to an input/output (10)) to determine voltage levels on board, and the customer handles setting power supplies differently based upon ECID value. Further, timing closure runs are adjusted for SVB. Thus, item 110 defines the "performance sorting ring oscillator" (PSRO)) and current leakage criteria for a particular bin on each part. Part of this information includes the identification of the cut point use by logic 112 to supply information to the voltage management unit (voltage regulator). As shown in FIG. 4 the logic 112 can alter the voltage at which the specific device operates.

Figure 5:
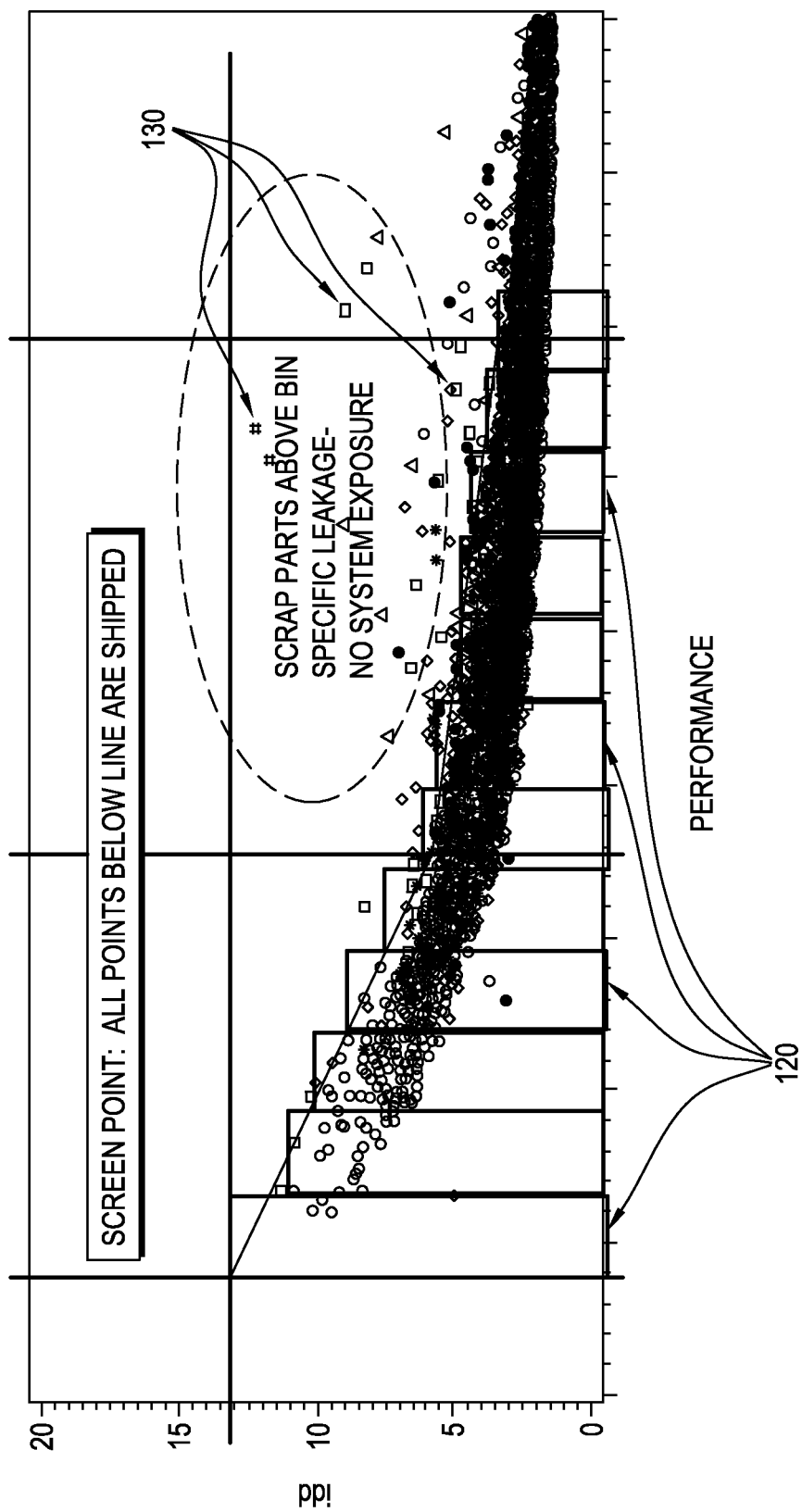
FIG. 5 is a chart illustrating the current limits of different voltage bins.

FIG. 5 is a chart of performance (speed) versus leakage current (idd) illustrating the different current leakage limits 120 that are set for each of the different voltage bins and the scattered data points 130 represent the measured current leakage obtained when the devices are tested at operating conditions and at operating temperature. Any device that produces current leakage above the bin-specific current leakage limit is considered unacceptable and is either scrapped or used for a different purpose.

Figure 6:
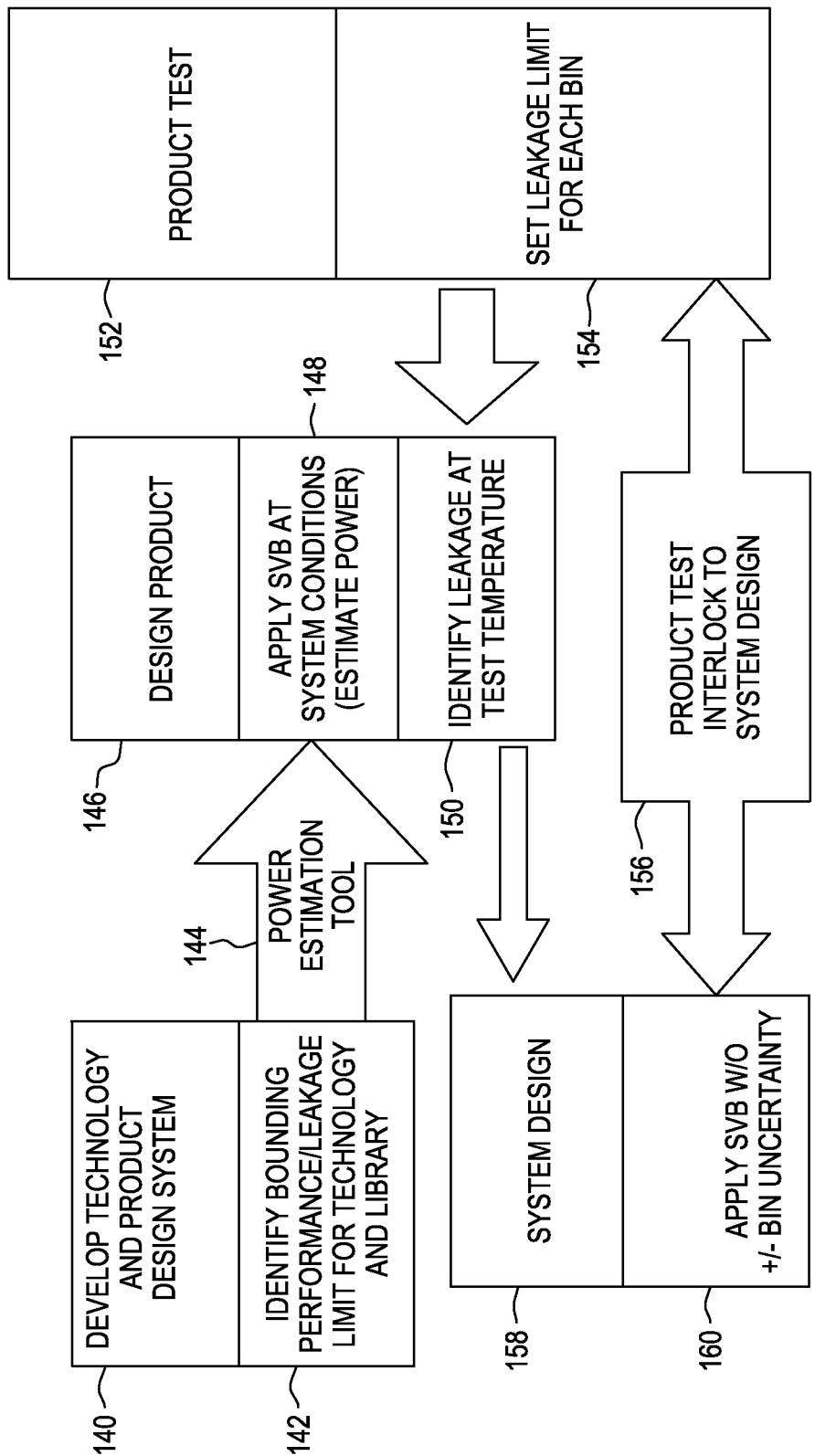
FIG. 6 is a flow diagram illustrating a process of using current leakage limits within a selective voltage binning operation.

FIG. 6 is a box diagram illustrating the overall logical operation of the various methods and devices herein. In FIG. 6, item 140 represents a system that is used to develop technology and product design and this system 140 is used to identify the bounding performance/leakage limits for a given technology and library 142. Such limits 142 are supplied to a power estimation tool 144. For a specific design product 146, the power estimation tool 144 is used to apply the selective voltage binning at system conditions in a power estimation process 148.

In item 152, the product is tested and this establishes the leakage limit for each bin 154 and this information is used to identify the leakage at test temperature 150. The current leakage limits 154 and tested current leakage 150 are used in the system design 158 such that the selective voltage binning can be applied without any bin uncertainty (item 160). Therefore, by setting the leakage limit for each bin 154 and eliminating unacceptable devices, the embodiments herein provide a product test interlock to the system design 156 that eliminates bin uncertainty.

Figure 7:
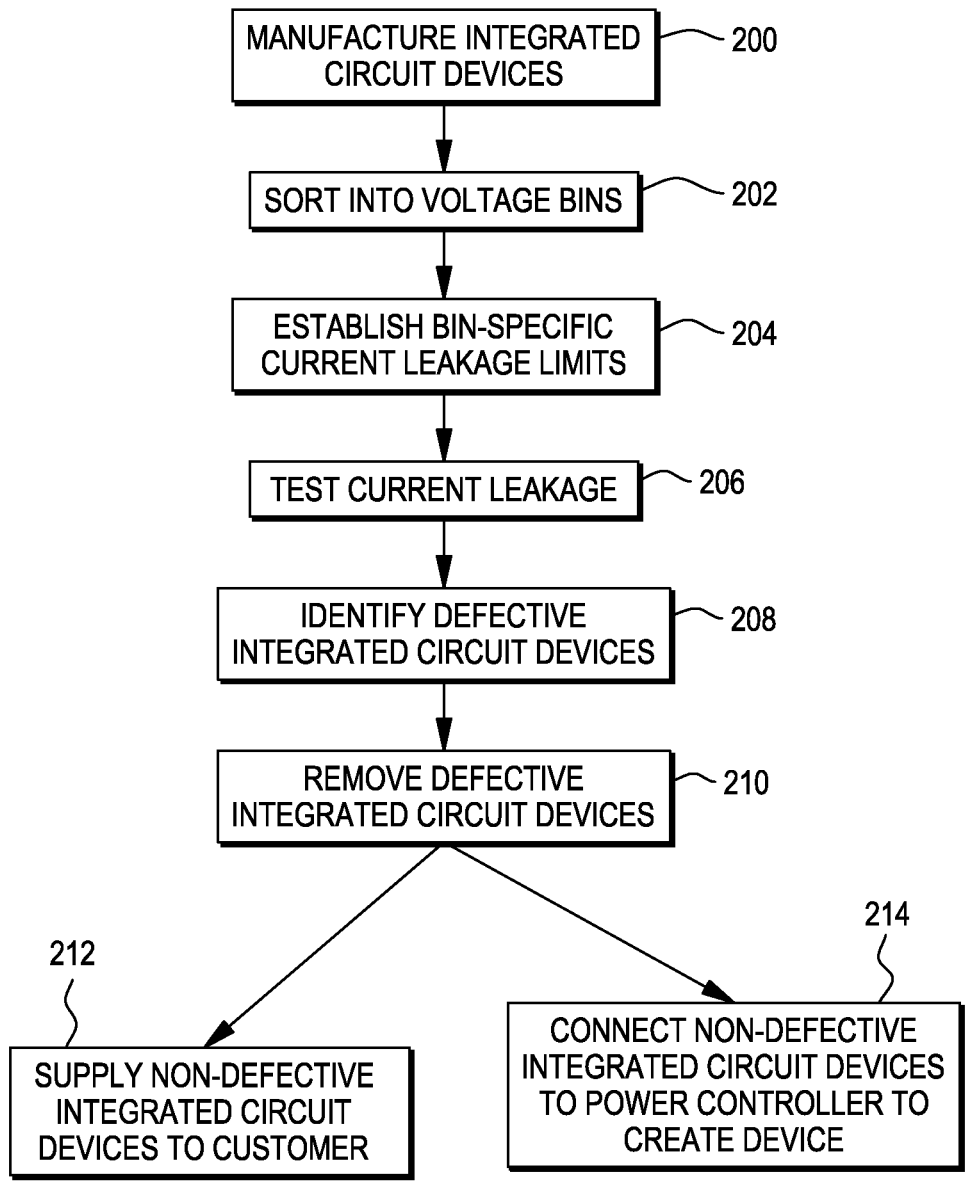
FIG. 7 is a flow diagram illustrating a process of using current leakage limits within a selective voltage binning operation.

FIG. 7 is a flow diagram illustrating an exemplary method herein that optimizes power usage in an integrated circuit design. In item 200 this exemplary method manufactures integrated circuit devices according to an integrated circuit design using manufacturing equipment. The integrated circuit design produces integrated circuit devices that are identically designed, but perform at different operating speeds caused by manufacturing process variations.

In item 202 this exemplary method divides the integrated circuit devices after manufacture into relatively slow integrated circuit devices and relatively fast integrated circuit devices to classify the integrated circuit devices into different voltage bins. The relatively fast integrated circuit devices consume more power than the relatively slow integrated circuit devices. When establishing the limits for the different voltage bins, the limits are established such that the relatively slow integrated circuit devices and relatively fast integrated circuit devices to consume a same maximum power.

In item 204 this exemplary method establishes a bin-specific current leakage limit for each of the voltage bins and tests the current leakage amounts of the integrated circuit devices using a tester in item 206. This allows the method to identify as defective ones of the integrated circuit devices that exceed the bin-specific integrated circuit current leakage limit of a corresponding voltage bin into which each of the digital circuits has been classified in item 208. The method removes the defective ones of the integrated circuit devices in item 210 to allow only non-defective integrated circuit devices to remain. These non-defective integrated circuit devices can be supplied to a customer (item 212) or a plurality of the non-defective integrated circuit devices can be operatively connected to a power controller to create a device (item 214).

Figure 8:
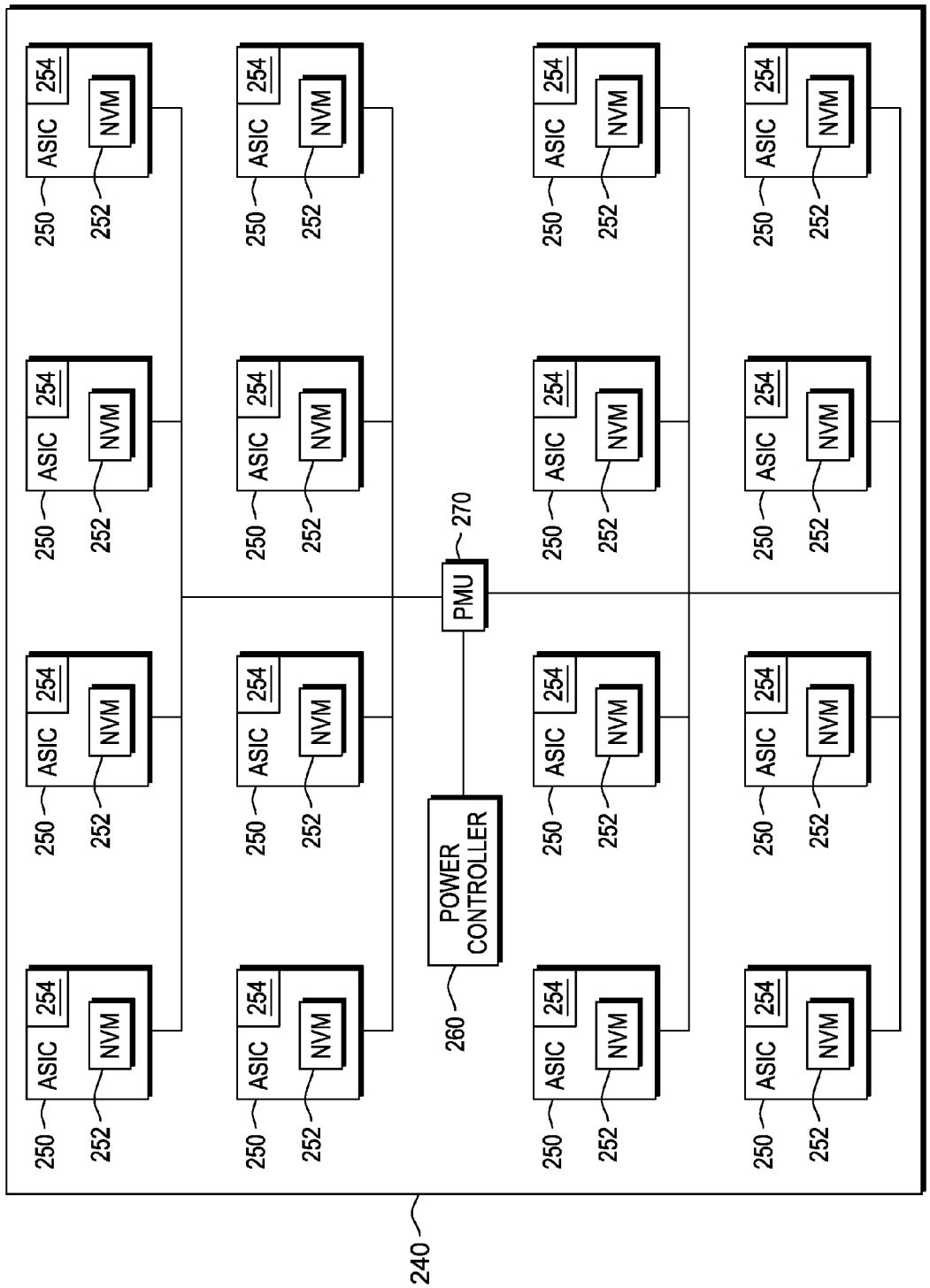
FIG. 8 is a schematic diagram of a device containing many integrated circuit devices that have the sorted into different voltage bins and that are controlled using a power controller.

FIG. 8 illustrates an additional embodiment herein which is a device 240 that comprises a plurality of digital circuits 250 manufactured from an identical circuit design, a power controller 260 operatively connect to the digital circuits, and a non-volatile storage medium 252 operatively connected to the power controller 260. In this example all the digital circuits 250 are application specific integrated circuits (ASIC); however, as would be understood by those ordinarily skilled in the art, any device could be used with the embodiments herein. As mentioned above, the digital circuits 250 are classified into different voltage bins, and each of the voltage bins has a current leakage limit. Each of the digital circuits 250 has been previously tested to operate within a corresponding current leakage limit of a corresponding voltage bin into which each of the digital circuits has been classified.

The non-volatile storage medium 252 stores boundaries of the voltage bins as speed-binning test data. The power controller 260 controls power-supply signals applied differently for each of the digital circuits 250 based on which bin each of the digital circuit has been classified and the speed-binning test data.

The speed-binning test data has been generated and stored in the non-volatile storage medium 252 during production testing of the digital circuits. The non-volatile storage medium 252 can comprise, for example, a programmable fuse block. The power controller 260 determines a speed constraint for a task to be executed by a given digital circuit 250 based on a voltage bin to which the digital circuit has been classified, and the power controller 260 also specifies levels of the power-supply signals for execution of the task based on such a speed constraint. Some embodiments can also include a sensor 254 that senses the temperature of a given digital circuit, and the current leakage testing is performed only within a temperature operating range of the digital circuit. Additional embodiments can also include a power management unit (PMU) 270 that receives instructions from the power controller 260 regarding levels of the power-supply signals and generates the power-supply signals based on the instructions.

Figure 9:
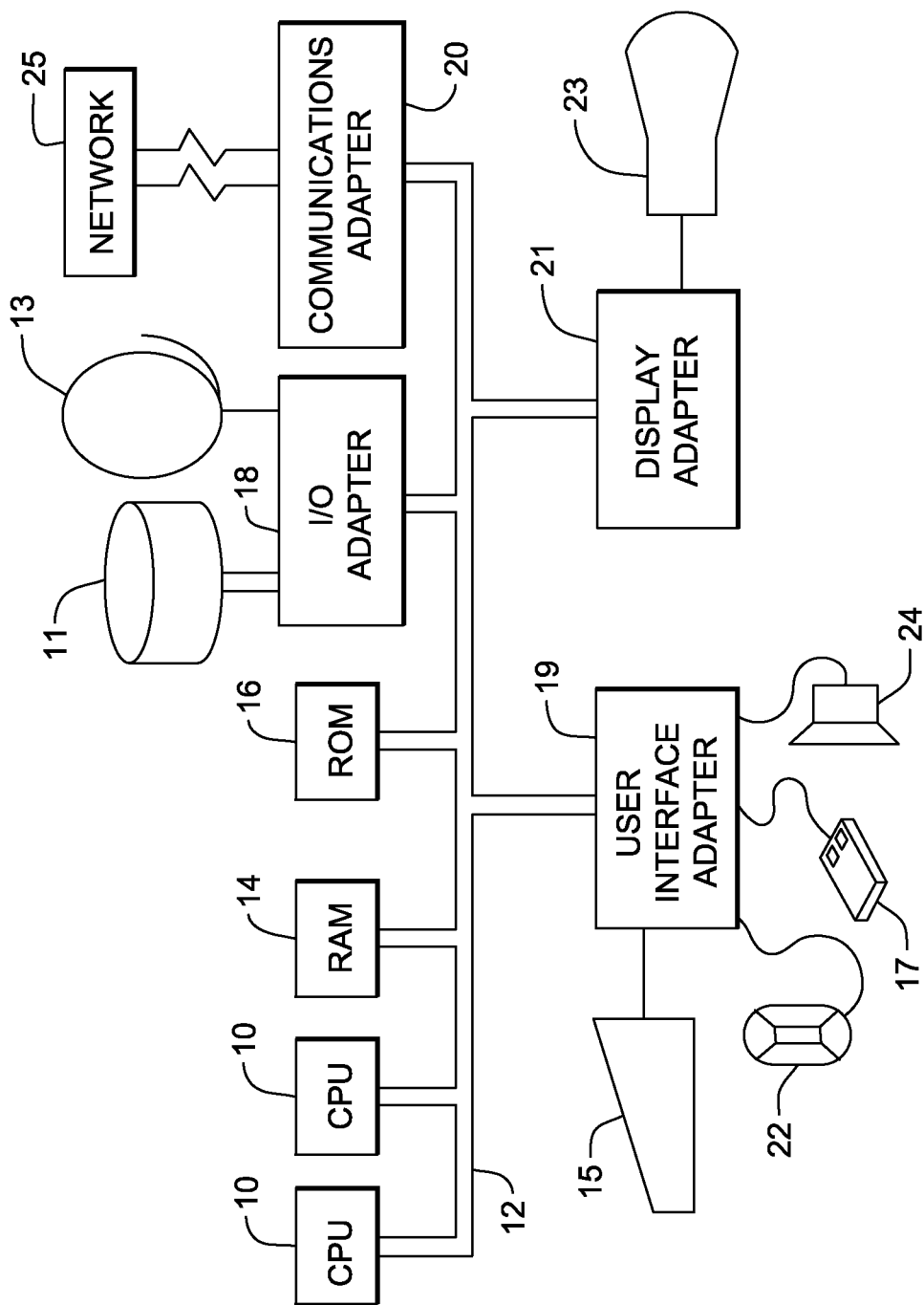
FIG. 9 is a schematic diagram of a hardware system according to embodiments herein.

A representative hardware environment for practicing the embodiments herein is depicted in FIG. 9. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of optimizing power usage in an integrated circuit design, said method comprising:
    manufacturing integrated circuit devices according to an integrated circuit design using manufacturing equipment, said integrated circuit design producing integrated circuit devices that are identically designed and perform at different operating speeds caused by manufacturing process variations;
    sorting said integrated circuit devices after manufacture into relatively slow integrated circuit devices and relatively fast integrated circuit devices to classify said integrated circuit devices into different voltage bins, said relatively fast integrated circuit devices consuming more power than said relatively slow integrated circuit devices,
    establishing a bin-specific current leakage limit for each of said voltage bins;
    testing current leakage amounts of said integrated circuit devices using a tester;
    identifying as defective ones of said integrated circuit devices that exceed said bin-specific integrated circuit current leakage limit of a corresponding voltage bin into which each of said digital circuits has been classified;
    removing said defective ones of said integrated circuit devices to allow only non-defective integrated circuit devices to remain; and
    supplying said non-defective integrated circuit devices to a customer.

2. The method of claim 1, further comprising establishing limits for said different voltage bins such that said relatively slow integrated circuit devices and relatively fast integrated circuit devices to consume a same maximum power.

3. The method of claim 1, further comprising embedding bin identification in said integrated circuit devices.

4. The method of claim 3, further comprising:
    reading said bin identification using a power controller operatively connected to said integrated circuit devices;
    determining a speed constraint for a task to be executed by a digital circuit based on a voltage bin to which said digital circuit has been classified using said power controller; and
    specifying levels of said power-supply signals for execution of said task based on said speed constraint using said power controller.

5. The method of claim 1, further comprising, during said testing, sensing a temperature of a digital circuit using a sensor and performing said testing only within a temperature operating range of said digital circuit.

6. The method of claim 1, said establishing of said bin-specific current leakage limit comprising design limits and limits based on empirical testing at operating conditions.

7. A method of optimizing power usage in an integrated circuit design, said method comprising:
    manufacturing integrated circuit devices according to an integrated circuit design using manufacturing equipment, said integrated circuit design producing integrated circuit devices that are identically designed and perform at different operating speeds caused by manufacturing process variations;
    sorting said integrated circuit devices after manufacture into relatively slow integrated circuit devices and relatively fast integrated circuit devices to classify said integrated circuit devices into different voltage bins, said relatively fast integrated circuit devices consuming more power than said relatively slow integrated circuit devices,
    establishing a bin-specific current leakage limit for each of said voltage bins;
    testing current leakage amounts of said integrated circuit devices using a tester;
    identifying as defective ones of said integrated circuit devices that exceed said bin-specific integrated circuit current leakage limit of a corresponding voltage bin into which each of said digital circuits has been classified;
    removing said defective ones of said integrated circuit devices to allow only non-defective integrated circuit devices to remain; and
    operatively connecting a plurality of said non-defective integrated circuit devices to a power controller to create a device.

8. The method of claim 7, further comprising establishing limits for said different voltage bins such that said relatively slow integrated circuit devices and relatively fast integrated circuit devices to consume a same maximum power.

9. The method of claim 7, further comprising embedding bin identification in said integrated circuit devices.

10. The method of claim 9, further comprising:
    reading said bin identification using said power controller;
    determining a speed constraint for a task to be executed by a digital circuit based on a voltage bin to which said digital circuit has been classified using said power controller; and
    specifying levels of said power-supply signals for execution of said task based on said speed constraint using said power controller.

11. The method of claim 7, further comprising, during said testing, sensing a temperature of a digital circuit using a sensor and performing said testing only within a temperature operating range of said digital circuit.

12. The method of claim 7, said establishing of said bin-specific current leakage limit comprising design limits and limits based on empirical testing at operating conditions.

13. A device comprising:
a plurality of digital circuits manufactured from an identical circuit design;
a power controller operatively connect to said digital circuits; and
a non-volatile storage medium operatively connected to said power controller,
said digital circuits being classified into different voltage bins,
each of said voltage bins having a current leakage limit,
said non-volatile storage medium storing boundaries of said voltage bins as speed-binning test data, and
said power controller controlling power-supply signals applied differently for each of said digital circuits based on which bin each of said digital circuit has been classified and said speed-binning test data.

14. The device of claim 13, said speed-binning test data having been generated and stored in said non-volatile storage medium during production testing of said digital circuits.

15. The device of claim 13, said non-volatile storage medium comprising a one-time programmable (OTP) fuse block.

16. The device of claim 13, wherein said power controller determines a speed constraint for a task to be executed by a digital circuit based on a voltage bin to which said digital circuit has been classified, and said power controller specifies levels of said power-supply signals for execution of said task based on said speed constraint.

17. The device of claim 13, further comprising a sensor that senses temperature of a digital circuit, testing of current leakage being performed only within a temperature operating range of said digital circuit.

18. The device of claim 13, said current leakage limit comprising design limits and limits based on empirical testing at operating conditions.

19. A device comprising:
a plurality of digital circuits manufactured from an identical circuit design;
a power controller operatively connect to said digital circuits; and
a non-volatile storage medium operatively connected to said power controller,
said digital circuits being classified into different voltage bins,
each of said voltage bins having a current leakage limit,
each of said digital circuits being previously tested to operate within a corresponding current leakage limit of a corresponding voltage bin into which each of said digital circuits has been classified,
said non-volatile storage medium storing boundaries of said voltage bins as speed-binning test data, and
said power controller controlling power-supply signals applied differently for each of said digital circuits based on which bin each of said digital circuit has been classified and said speed-binning test data.

20. The device of claim 19, said speed-binning test data having been generated and stored in said non-volatile storage medium during production testing of said digital circuits.

21. The device of claim 19, said non-volatile storage medium comprising a one-time programmable (OTP) fuse block.

22. The device of claim 19, wherein said power controller determines a speed constraint for a task to be executed by a digital circuit based on a voltage bin to which said digital circuit has been classified, and said power controller specifies levels of said power-supply signals for execution of said task based on said speed constraint.

23. The device of claim 19, further comprising a sensor that senses temperature of a digital circuit, testing of current leakage being performed only within a temperature operating range of said digital circuit.

24. The device of claim 19, said current leakage limit comprising design limits and limits based on empirical testing at operating conditions.

* * * * *